(12) United States Patent
Aitken et al.

(10) Patent No.: US 7,736,915 B2
(45) Date of Patent: Jun. 15, 2010

(54) METHOD FOR NEUTRALIZING TRAPPED CHARGE IN A CHARGE ACCUMULATION LAYER OF A SEMICONDUCTOR STRUCTURE

(75) Inventors: John M. Aitken, South Burlington, VT (US); Ethan Harrison Cannon, Essex Junction, VT (US); Alvin Wayne Strong, Essex Junction, VT (US)

(73) Assignee: International Business Machines Corporation, Armonk, NY (US)

( * ) Notice: Subject to any disclaimer, the term of this patent is extended or adjusted under 35 U.S.C. 154(b) by 194 days.

(21) Appl. No.: 11/276,248

(22) Filed: Feb. 21, 2006

(65) Prior Publication Data
US 2007/0195841 A1   Aug. 23, 2007

(51) Int. Cl.
*H01L 21/00* (2006.01)
*H01L 31/00* (2006.01)
*H01L 31/0248* (2006.01)
*H01L 31/0352* (2006.01)

(52) U.S. Cl. .................. 438/10; 438/4; 438/5; 438/12; 438/13; 257/141; 257/E31.001; 257/E31.002; 257/E31.032

(58) Field of Classification Search ................ 438/311, 438/378, 516, 795, 4, 5, 10, 12; 257/E29.281, 257/648, 349, 215, 225, 226, 235, 238, 141, 257/E31.001, E31.002, E31.032
See application file for complete search history.

(56) References Cited

U.S. PATENT DOCUMENTS

| | | | |
|---|---|---|---|
| 5,360,752 A | 11/1994 | Brady et al. ................. | 999/62 |
| 5,795,813 A | 8/1998 | Hughes et al. ............... | 438/423 |
| 5,923,067 A * | 7/1999 | Voldman ..................... | 257/349 |
| 6,268,630 B1 | 7/2001 | Schwank et al. ............. | 257/347 |
| 6,459,125 B2 | 10/2002 | Maeda et al. ................ | 257/347 |
| 6,917,078 B2 | 7/2005 | Bhattacharyya ............. | 257/347 |
| 7,271,608 B1 * | 9/2007 | Vermeire et al. ............ | 324/763 |
| 2005/0179093 A1* | 8/2005 | Morris ........................ | 257/371 |

OTHER PUBLICATIONS

Nowlin, R.N.; Schrimpf, R.D.; Enlow, E.W.; Combs, W.E.; Pease, R.L.; Bipolar Circuits and Technology Meeting, 1991., Sep. 9-10, 1991 pp. 174-177.*

* cited by examiner

*Primary Examiner*—Phat X Cao
*Assistant Examiner*—Diana C Garrity
(74) *Attorney, Agent, or Firm*—Schmeiser, Olsen & Watts; Richard M. Kotulak

(57) ABSTRACT

A method for neutralizing trapped charges in a buried oxide layer. The method includes providing a semiconductor structure which includes (a) a semiconductor layer, (b) a charge accumulation layer on top of the semiconductor layer, and (c) a doped region in direct physical contact with the semiconductor layer, wherein the charge accumulation layer comprises trapped charges of a first sign, and wherein the doped region and the semiconductor layer form a P-N junction diode. Next, free charges are generated in the P-N junction diode, wherein the free charges are of a second sign opposite to the first sign. Next, the free charges are accelerated towards the charge accumulation layer, resulting in some of the free charges entering the charge accumulation layer and neutralizing some of the trapped charges in the charge accumulation layer.

8 Claims, 5 Drawing Sheets

US 7,736,915 B2

METHOD FOR NEUTRALIZING TRAPPED CHARGE IN A CHARGE ACCUMULATION LAYER OF A SEMICONDUCTOR STRUCTURE

BACKGROUND OF THE INVENTION

1. Technical Field

This invention relates to gate charge neutralization, and more specifically, to charge neutralization in semiconductor structures.

2. Related Art

In a typical semiconductor structure comprising an oxide layer, holes may be trapped in the oxide layer causing the semiconductor structure to malfunction. Therefore, there is a need for a structure (and a method for operating the same) that allows for neutralizing the trapped charges.

SUMMARY OF THE INVENTION

The present invention provides a charge neutralizing method, comprising providing a semiconductor structure which includes (a) a semiconductor layer, (b) a charge accumulation layer on top of the semiconductor layer, and (c) a doped region in direct physical contact with the semiconductor layer, wherein the charge accumulation layer comprises trapped charges of a first sign, and wherein the doped region and the semiconductor layer form a P-N junction diode; generating free charges in the P-N junction diode, wherein the free charges are of a second sign opposite to the first sign; and accelerating the free charges towards the charge accumulation layer, resulting in some of the free charges entering the charge accumulation layer and neutralizing some of the trapped charges in the charge accumulation layer.

The present invention also provides a semiconductor structure, comprising (a) a semiconductor layer; (b) a charge accumulation layer on top of the semiconductor layer; (c) a doped region in direct physical contact with the semiconductor layer; and (d) a device layer on top of the charge accumulation layer, wherein the device layer comprises N device regions electrically insulated from each other, N being a positive integer, wherein the charge accumulation layer comprises trapped charges of a first sign, wherein the doped region and the semiconductor layer form a P-N junction diode being forward-biased, and wherein the P-N junction diode comprises free charges of a second sign opposite to the first sign.

The present invention also provides a semiconductor structure, comprising (a) a semiconductor layer; (b) a charge accumulation layer on top of the semiconductor layer; (c) a doped region in direct physical contact with the semiconductor layer; and (d) a device layer on top of the charge accumulation layer, wherein the device layer comprises N device regions electrically insulated from each other, N being a positive integer, wherein the charge accumulation layer comprises trapped charges of a first sign, wherein the doped region and the semiconductor layer form a P-N junction diode being reversed-biased, and wherein the P-N junction diode comprises free charges of a second sign opposite to the first sign.

The present invention provides a structure (and a method for operating the same) that allows for neutralizing the trapped charges.

DETAILED DESCRIPTION OF THE INVENTION

Figure 1:
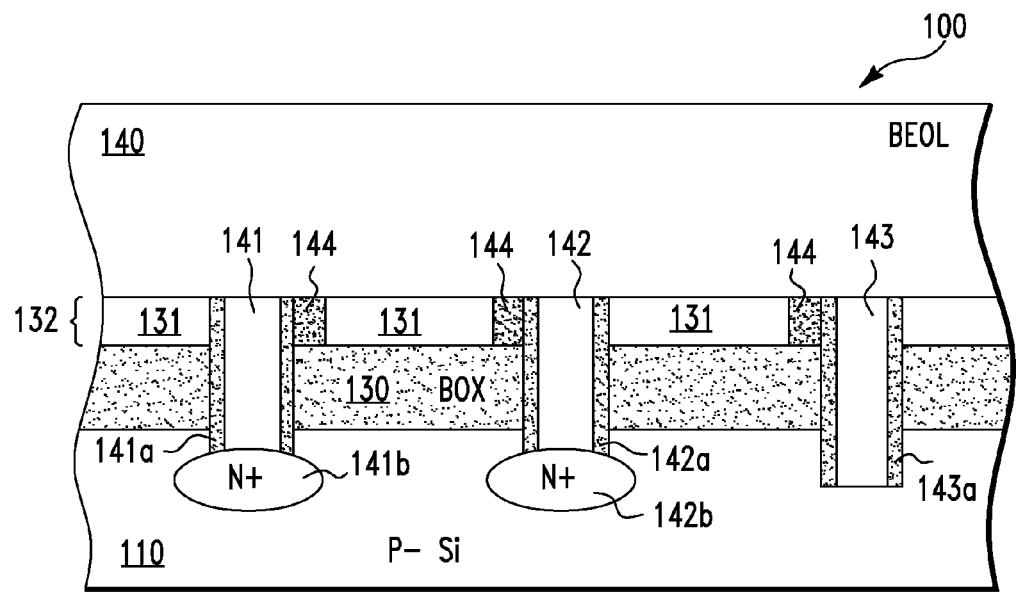
FIGS. 1-3 show a semiconductor structure, in accordance with first embodiments of the present of invention.

FIG. 1 shows a cross-section view of a semiconductor structure 100, in accordance with embodiments of the present of invention. More specifically, in one embodiment, the semiconductor structure 100 comprises a P− semiconductor substrate 110 and an insulating layer 130, e.g. a buried oxide (BOX) layer, on the P− semiconductor (e.g., silicon, germanium, etc.) substrate 110.

In one embodiment, the semiconductor structure 100 further comprises a device layer 132 on the BOX layer 130. Illustratively, the device layer 132 includes many device regions 131 (comprising silicon in one embodiment) but only three device regions 131 are shown in FIG. 1. It should be noted that the device layer 132 may include active devices such as transistors.

In one embodiment, the semiconductor structure 100 further comprises (i) interconnect layers 140 (or also referred to as BEOL layer—Back End Of Line layer) on the device layer 132 and (ii) shallow trench isolation (STI) regions 144 for electrically separating the device regions 131 from each other. In one embodiment, the STI regions 144 comprise silicon dioxide.

In one embodiment, the semiconductor structure 100 further comprises (i) N+ doped silicon regions 141b and 142b in the P− semiconductor substrate 110 and (ii) diode contact regions 141 and 142 in direct physical contact with the N+ doped silicon regions 141b and 142b, respectively. In one embodiment, the diode contact regions 141 and 142 comprise N+ doped polysilicon.

It should be noted that the N+ doped silicon region 141b and the P− semiconductor substrate 110 form a first P-N junction. The first P-N junction can be considered a P-N junction diode which can be referred to as a P-N junction diode 141b+110. Similarly, the N+ doped silicon region 142b and the P− semiconductor substrate 110 form a second P-N junction. The second P-N junction can be considered a P-N junction diode which can be referred to as a P-N junction diode 142b+110.

In one embodiment, the semiconductor structure 100 further comprises a substrate contact region 143 in direct physical contact with the P− semiconductor substrate 110. Illustratively, the substrate contact region 143 comprises polysilicon.

It should be noted that the BEOL layer 140 may have many wires (not shown) that provide electrical paths to the device regions 131, the diode contact regions 141 and 142, and the substrate contact region 143 of the semiconductor structure 100.

In one embodiment, the formation of the semiconductor structure 100 of FIG. 1 is as follows. Illustratively, the formation of the semiconductor structure 100 starts with an SOI (silicon on insulator) substrate 110+130+132 which comprises the layers 110, 130, and 132.

Next, in one embodiment, the STI regions 144 are formed in the device layer 132 of the SOI substrate 110+130+132 using a conventional method so as to form the device regions 131.

Next, in one embodiment, contact holes 141, 142, and 143 are formed in the SOI substrate 110+130+132 using a conventional method. Then, insulating layers 141a, 142a, and 143a are formed on sidewalls of the contact holes 141, 142, and 143, respectively using a conventional method.

Next, in one embodiment, the contact holes 141 and 142 are filled with N+ doped polysilicon having dopants with a high diffusivity in silicon, e.g. phosphorus, so as to form the diode contact regions 141 and 142, respectively. Next, in one embodiment, the contact hole 143 is filled with P+ polysilicon so as to form the substrate contact region 143.

Next, in one embodiment, the semiconductor structure 100 is annealed at high temperatures such that dopants from the diode contact regions 141 and 142 diffuse into the P− semiconductor substrate 110 resulting in the N+ doped silicon regions 141b and 142b, respectively.

Next, in one embodiment, devices (not shown) such as transistors, capacitors, and resistors are fabricated in the device regions 131 using conventional methods.

Next, in one embodiment, the BEOL layer 140 is formed on top the device layer 132 using a conventional method so as to provide electrical paths to the diode contact regions 141 and 142, the device regions 131 in the device layer 132, and the substrate contact region 143.

In one embodiment, with reference to FIG. 1, the charge neutralizing operation of the structure 100 is as follows. Illustratively, the voltage potential of the P− semiconductor substrate 110 is set at −4V, and the voltage potentials of the N+ doped silicon regions 141b and 142b are set at −5V. As a result, the P-N junction diodes 141b+110 and 142b+110 are forward biased. Therefore, electrons are injected from the N+ doped silicon regions 141b and 142b into the P− semiconductor substrate 110.

In one embodiment, the voltage potentials of the device regions 131 are set at values higher than the voltage potential of the P− semiconductor substrate 110. As a result, the injected electrons in the P− semiconductor substrate 110 are pulled toward the device regions 131 and some of the injected electrons can enter the BOX layer 130 and neutralize trapped holes which may be present in the BOX layer 130. It should be noted that when the structure 100 is exposed to radiation, electron-hole pairs may be created in the BOX layer 130. The electrons of the created electron-hole pairs having high mobility can easily escape the BOX layer 130, whereas the holes of the created electron-hole pairs having low mobility become trapped holes in the BOX layer 130. Also, some standard processing steps involve tools that emit ionizing radiation, such as soft X-rays, so the standard process can generate trapped holes in the BOX layer 130.

In one embodiment, the voltage potentials of the device regions 131 are set in a range from ground (i.e., 0V) to VDD wherein the VDD is in a range from 0.5V to 5V.

In one embodiment, during the normal operation of the structure 100, the P− semiconductor substrate 110, the substrate contact region 143 and the diode contact regions 141 and 142 are connected to the ground, whereas the device regions 131 are coupled to voltage potentials in the operating voltage range from 0V to VDD.

Figure 2:
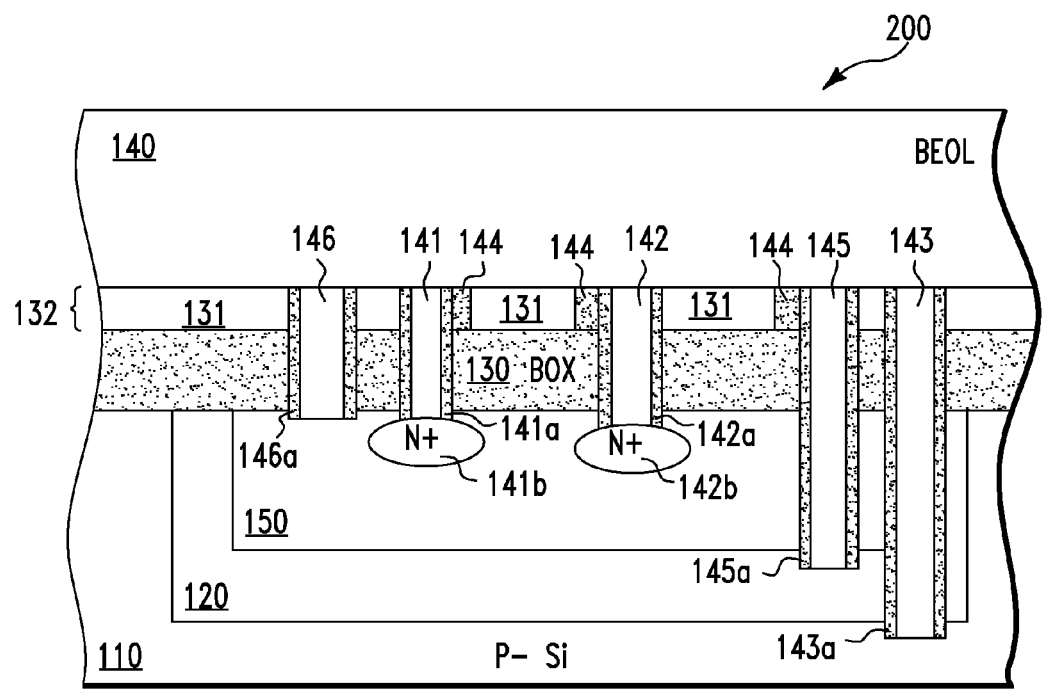

FIG. 2 shows a cross-section view of a structure 200, in accordance with embodiments of the present invention. In one embodiment, the structure 200 of FIG. 2 is similar to the structure 100 of FIG. 1, except that the structure 200 comprises (i) an N+ well 120 in the semiconductor substrate 110, (ii) a P− well 150 in the N+ well 120, (iii) an N+ well contact region 145 electrically coupled to the N+ well 120, and (iv) a P− well contact region 146 electrically coupled to the P− well 150. In one embodiment, the contact regions of the structure 200 of FIG. 2 are formed using any conventional method.

In one embodiment, the fabrication of the structure 200 of FIG. 2 is similar to the fabrication of the structure 100 of FIG. 1, except that the N+ well 120 and P− well 150 can be formed by ion implantation.

In one embodiment, the formation of the SOI substrate 110+130+132 for forming the structure 200 of FIG. 2 is as follows. Illustratively, on one hand with reference to FIG. 3A, the formation of the SOI substrate 110+130+132 is started with the substrate 110. Next, in one embodiment, the N+ well 120 and the P− well 150 are respectively formed on the top surface of the substrate 110 by ion implantation resulting in a structure 220 of FIG. 3A (also called handler wafer 220).

Figure 3A:
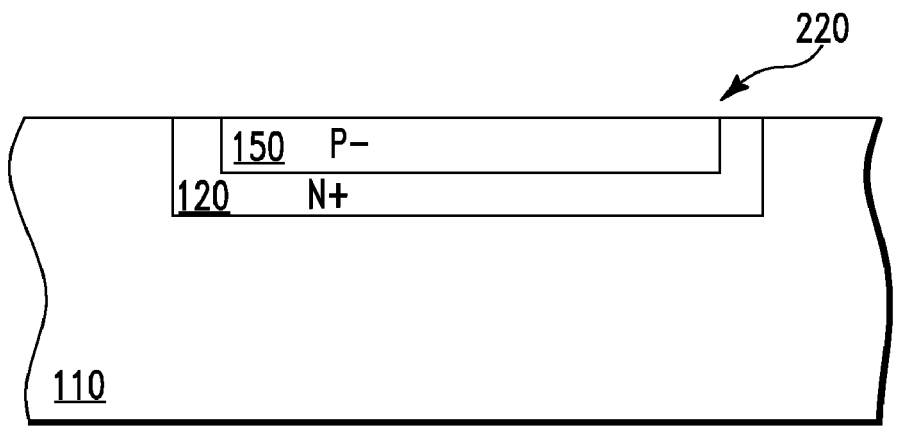
Figure 3B:
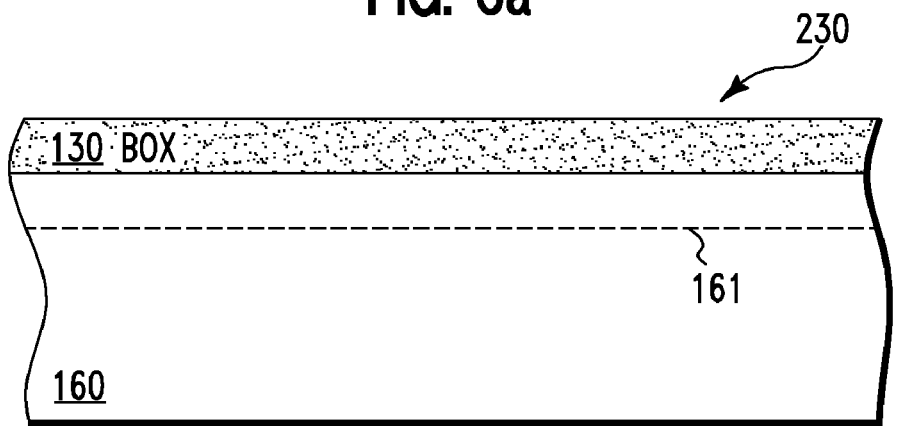

On the other hand with reference to FIG. 3B, the BOX layer 130 is formed on a wafer 230 by, illustratively, a chemical vapor deposition (CVD) process.

Next, in one embodiment, hydrogen ions are implanted in the silicon substrate 160 so as to form a hydrogen ion layer 161 embedded in the silicon substrate 160. The portion of the silicon substrate 160 above the hydrogen ion layer 161 will become the device layer 132.

Figure 3C:
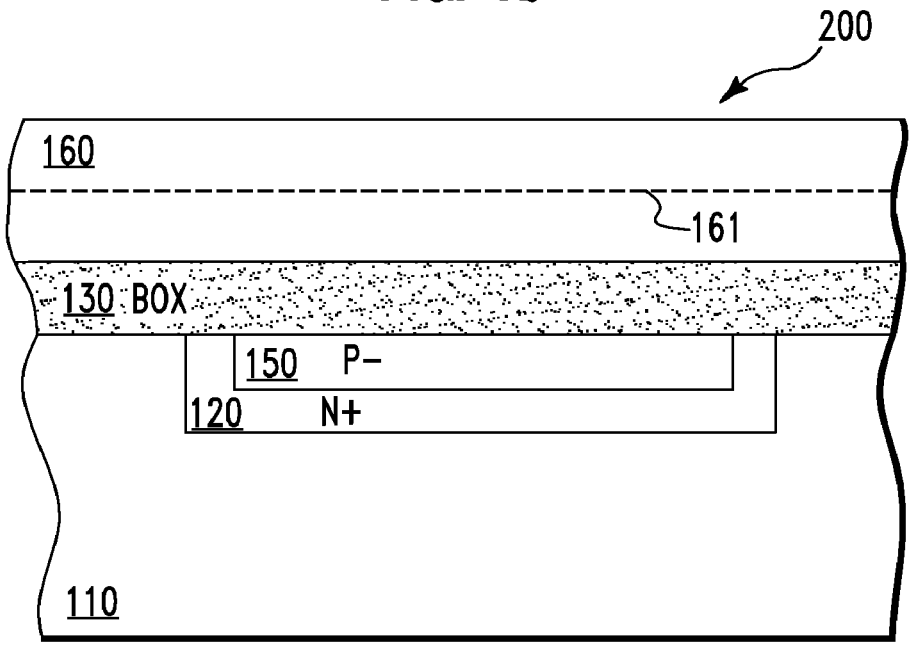

Next, in one embodiment, the wafer 230 of FIG. 3B is turned upside down and bonded to the handler wafer 220 of FIG. 3A, resulting in the structure 200 of FIG. 3C.

Next, in one embodiment, the structure 200 of FIG. 3C is annealed so that the structure 200 of FIG. 3C splits along the hydrogen ion layer 161 (SMARTCUT™ process). The lower portion of the structure 200 of FIG. 3C after the split is the SOI substrate 110+130+132 which is used to form the structure 200 of FIG. 2.

In one embodiment, with reference to FIG. 2, the charge neutralizing operation of the structure 200 is similar to the charge neutralizing operation of the structure 100 of FIG. 1. More specifically, for illustration, the voltage potential of the P− well 150 is set at −4V, and the voltage potentials of the N+ doped silicon regions 141b and 142b are set at −5V. In one embodiment, the N+ well 120 and the semiconductor substrate 110 are coupled to ground, and the voltage potentials of the device regions 131 are set in a range from ground to VDD. As a result, electrons are injected from the N+ doped silicon regions 141b and 142b into the P− well 150. Then, the injected electrons in the P− well 150 are pulled toward the device regions 131 and some of the injected electrons may enter the BOX layer 130 and may neutralize trapped holes which may be present in the BOX layer 130.

It should be noted that the N+ well 120 and the semiconductor substrate 110 being at ground ensures that devices (not shown) in the device regions 131 not directly above the P− well 150 can be in normal operation during the charge neutralizing operation described above.

Figure 4:
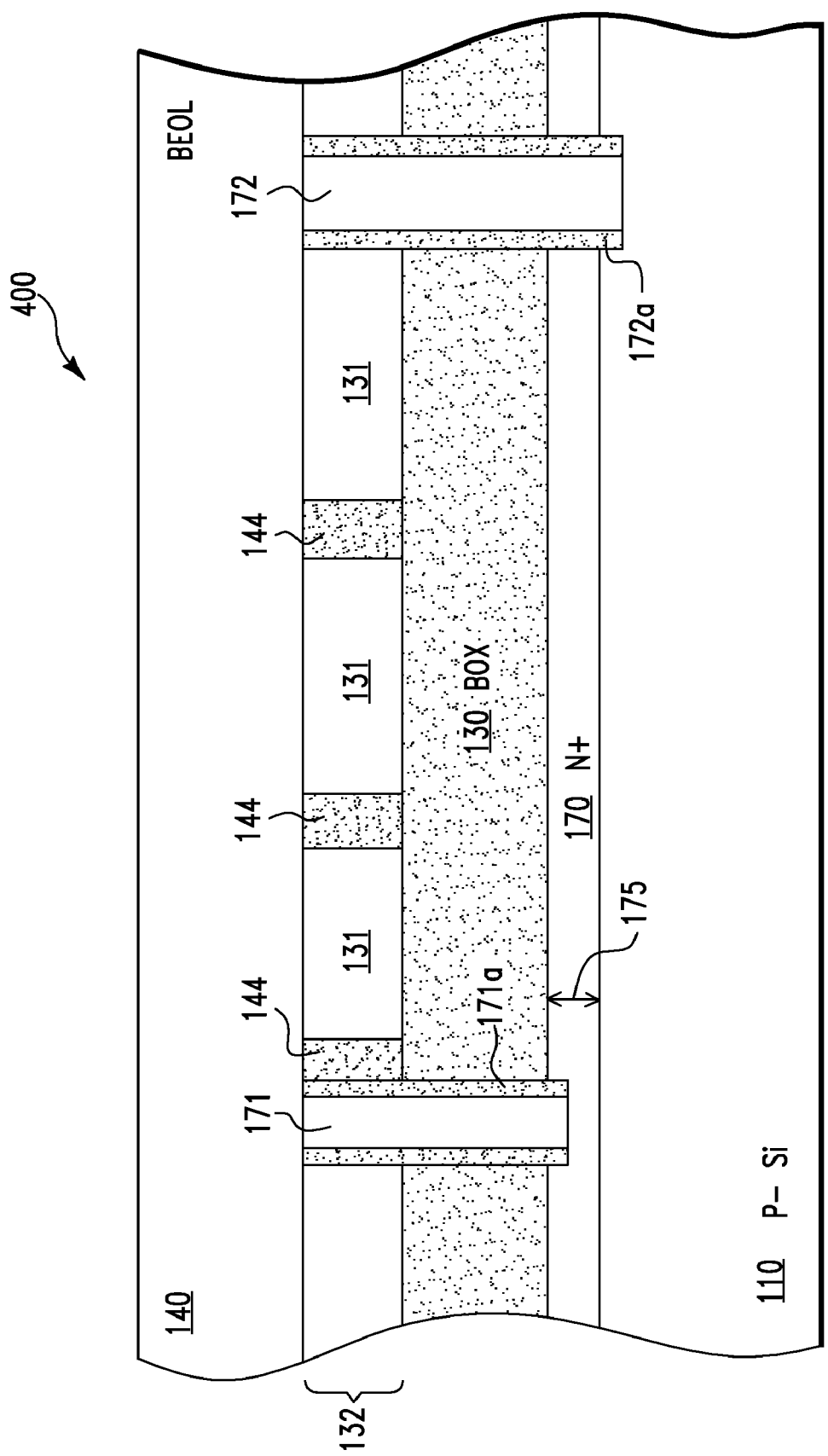
FIGS. 4-6 show another semiconductor structure in accordance with second embodiments of the present invention.

FIG. 4 shows a cross-section view of a structure 400, in accordance with embodiments of the present invention. In one embodiment, the structure 400 is similar to the structure 100 of FIG. 1, except that the N+ doped silicon regions 141b and 142b and the diode contact regions 141 and 142 of FIG. 1 are replaced by (i) an N+ silicon layer 170 and (ii) a diode contact region 171 (comprising polysilicon in one embodiment) electrically coupled to the N+ silicon layer 170, respectively.

In one embodiment, the N+ silicon layer 170 is sandwiched between the P− semiconductor substrate 110 and the BOX layer 130.

In one embodiment, the formation of the structure 400 of FIG. 4 is similar to the formation of the structure 100 of FIG. 1, wherein the N+ silicon layer 170 can be formed by ion implantation.

In one embodiment, the formation of the SOI substrate 110+170+130+132 for forming the structure 400 of FIG. 4 is as follows. Illustratively, on one hand, with reference to FIG. 5A, the formation of the structure 400 (FIG. 4) is started with the P− semiconductor substrate 110. Next, in one embodiment, a top layer 170 of P− semiconductor substrate 110 is heavily doped by, illustratively, ion implantation, with N-type dopants (such as arsenic) to form the N+ silicon layer 170, resulting in the structure 520 of FIG. 5A (also called a handler wafer 520).

Figure 5A:
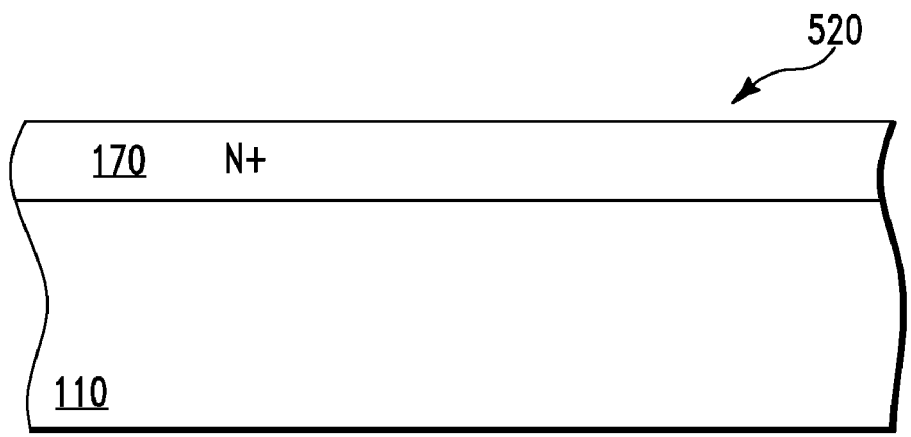
Figure 5B:
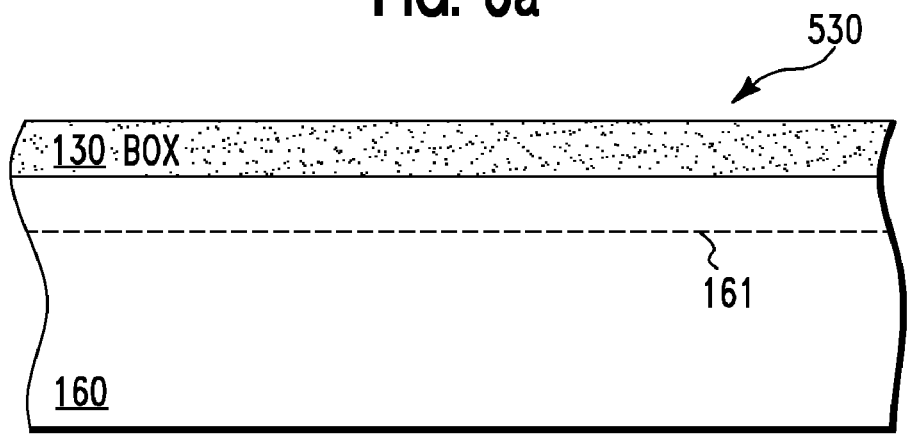

In one embodiment, on the other hand, with reference to FIG. 5B, a wafer 530 is formed. Illustratively, the formation of wafer 530 of FIG. 5B is similar to the formation of wafer 230 of FIG. 3B as described above.

Figure 5C:
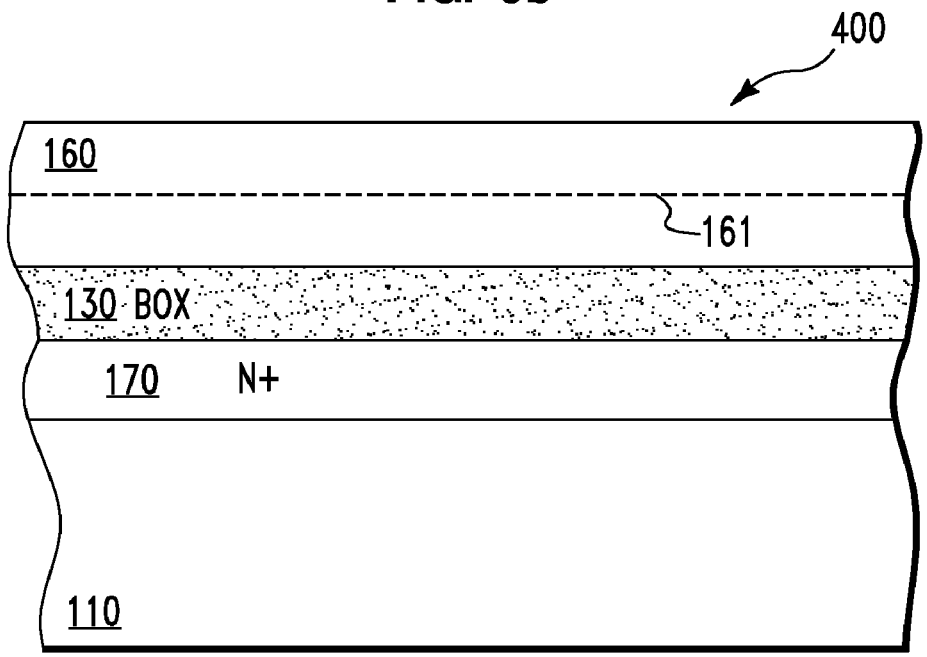

Next, in one embodiment, the wafer 530 of FIG. 5B is turned upside down and bonded to the handler wafer 520 of FIG. 5A, resulting in the structure 400 of FIG. 5C.

Next, in one embodiment, the structure 400 of FIG. 5C is annealed so that the structure 400 of FIG. 5C splits along the hydrogen ion layer 161. The lower portion of the structure 400 of FIG. 5C after the split is the SOI substrate 110+170+130+132 which is used to form the structure 400 of FIG. 4.

In one embodiment, with reference to FIG. 4, the charge neutralizing operation of the structure 400 is as follows. More specifically, for illustration, the voltage potential of the P-semiconductor substrate 110 is set at −5V, the voltage potential of the N+ silicon layer 170 is set at −1V, and the device layers 131 are set at a voltage higher than the voltage of the N+ silicon layer 170. In one embodiment, the device layers 131 are set at a voltage in a range from ground to VDD. As a result, the P-N junction diode 170+110 is reverse biased resulting in a depletion layer (not shown) at P-N junction of the P-N junction diode 170+110. Even at room temperature, some electron-hole pairs are thermally generated in the depletion layer of the P-N junction diode 170+110. The electrons of the created electron-hole pairs in the depletion layer are accelerated up by the electric field and move in the direction from the P-semiconductor substrate 110 to the N+ silicon layer 170. Because the voltage potentials of the device regions 131 are set at values higher than the voltage potential of the N+ silicon layer 170, as a result, this creates an electric field between the N+ silicon layer 170 and the device regions 131 that helps pull the free electrons of the created electron-hole pairs from the depletion layer to the BOX layer 130. In one embodiment, the contact regions 171 and 172 of the structure 400 of FIG. 4 are formed using any conventional method.

In one embodiment, the structure 400 of FIG. 4 is exposed to radiation (not shown) to create electron-hole pairs in the depletion layer of the P-N junction diode 170+110. In another embodiment, the structure 400 of FIG. 4 is put on a heat chuck (not shown) to create electron-hole pairs in the depletion layer of the P-N junction diode 170+110 through thermal generation. The electrons of the created electron-hole pairs in the depletion layer are accelerated up by the electric field and move in the direction from the P− semiconductor substrate 110 to the N+ silicon layer 170.

In one embodiment, a thickness 175 of the N+ silicon layer 170 is such that some of the accelerated electrons pass through the N+ silicon layer 170 and enter the BOX layer 130 and neutralize trapped holes that may be present there.

In one embodiment, during the normal operation of the structure 400, the P− semiconductor substrate 110, the substrate contact region 172, and the diode contact region 171 are connected to the ground, whereas the device regions 131 are coupled to voltage potentials in the operating voltage range from 0V to VDD.

Figure 6:
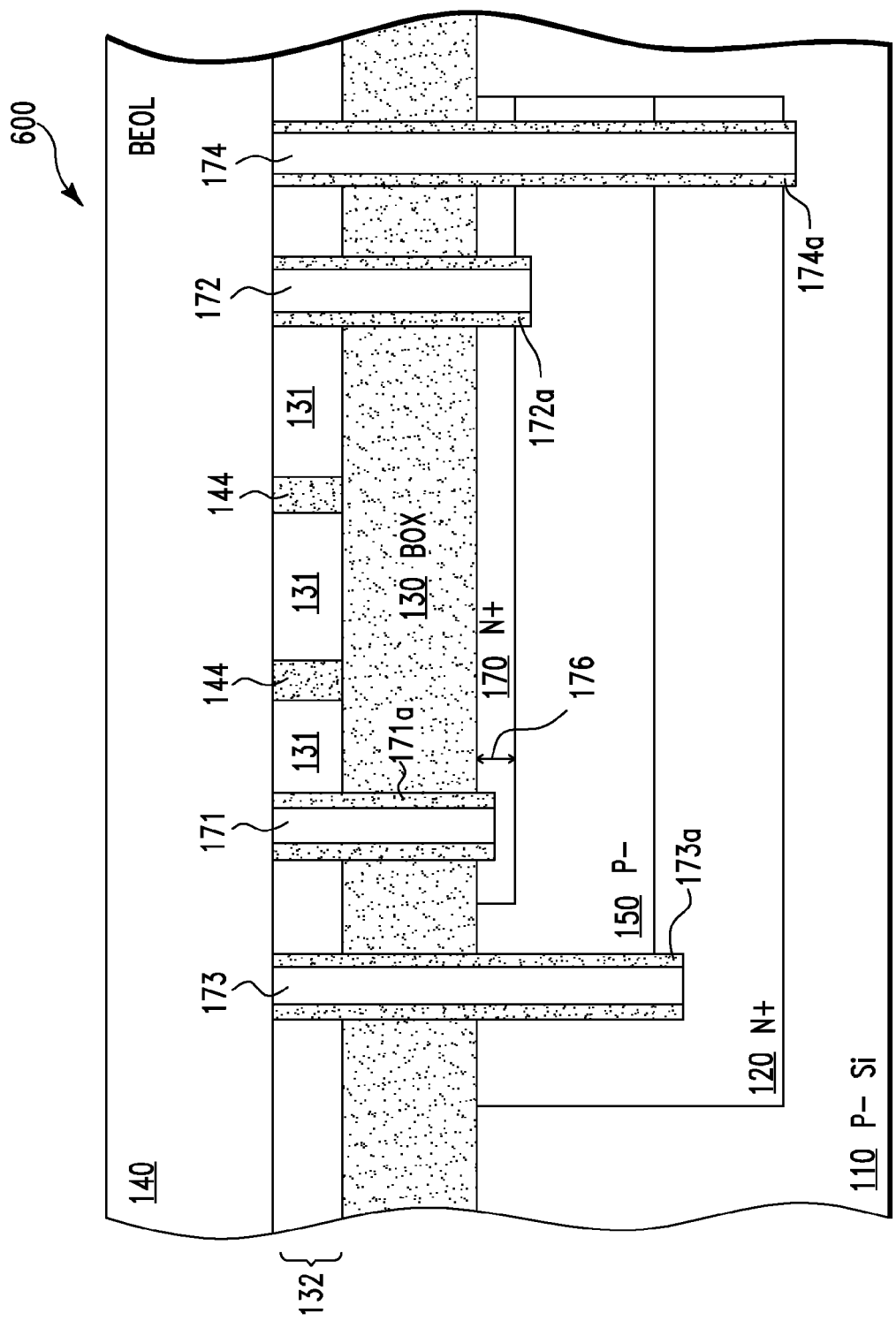

FIG. 6 shows a cross-section view of a structure 600, in accordance with embodiments of the present invention. In one embodiment, the structure 600 of FIG. 6 is similar to the structure 400 of FIG. 4, except that the structure 600 comprises (i) an N+ well 120 in the semiconductor substrate 110, (ii) a P− well 150 in the N+ well 120, (iii) an N+ well contact region 173 electrically coupled to the N+ well 120, and (iv) a P− well contact region 172 electrically coupled to the P− well 150.

In one embodiment, the fabrication of the structure 600 of FIG. 6 is similar to the fabrication of the structure 400 of FIG. 4, wherein the N+ well 120 and P− well 150 can be formed by ion implantation. In one embodiment, the contact regions of the structure 600 of FIG. 6 are formed using any conventional method.

In one embodiment, with reference to FIG. 6, the charge neutralizing operation of the structure 600 is similar to the charge neutralizing operation of the structure 400 of FIG. 4. More specifically, for illustration, the voltage potential of the P− well 150 is set at −5V, and the voltage potential of the N+ silicon layer 170 is set at −1V. In one embodiment, the N+ well 120 and the semiconductor substrate 110 are coupled to ground, and the voltage potentials of the device regions 131 are set at a voltage higher than the voltage of the N+ silicon layer 170. In one embodiment, the device layers 131 are set at a voltage in a range from ground to VDD.

In one embodiment, the structure 600 of FIG. 6 is exposed to radiation (not shown) to create electron-hole pairs in the depletion layer of the P-N junction diode 170+110. In another embodiment, the structure 600 of FIG. 6 is put on a heat chuck (not shown) to create electron-hole pairs in the depletion layer of the P-N junction diode 170+110 through thermal generation. The electrons of the created electron-hole pairs in the depletion layer are accelerated up by the electric field and move in the direction from the P− semiconductor substrate 110 to the N+ silicon layer 170.

In one embodiment, a thickness 176 of the N+ silicon layer 170 is such that some of the accelerated electrons pass through the N+ silicon layer 170 and enter the BOX layer 130 and neutralize trapped holes that may be present there. It should be noted that the N+ well 120 and the semiconductor substrate 110 being at ground ensures that devices (not shown) in the device regions 131 not directly above the P− well 150 can be in normal operation during the charge neutralizing operation described above.

In different embodiments, the charge neutralizing operation of the structures 100, 200, 400, and 600 can be performed in three modes: (i) one time operation mode in which the charge neutralizing operation is performed only when trapped holes are accumulated in the BOX layer 130 exceeding a certain level, (ii) periodic operation mode in which the charge neutralizing operation is performed periodically applicable to the case when the structures 100, 200, 400, 600 are subject to radiation, and (iii) continuous operation mode in which the charge neutralizing operation is performed continuously and simultaneously with the normal operation of the structure 100, 200, 400, 600. In case (i) or case (ii), the charge neutralization operation can be applied after a charge accumulation monitor circuit indicates the trapped charge in the BOX layer 130 exceeds a preset limit. Note that in case (iii), device design must be done such that devices in the device regions 131 can operate with the potential in the layers below the BOX layer 130 at a potential other than ground.

It should be noted that the devices directly above the P− well 150 of the structure 200 of FIG. 2 and the structure 600 of FIG. 6 can be in charge neutralizing operation, while other devices outside the P− well 150 of the structure 200 and the structure 600 can be in normal operation.

In the embodiments described above, with reference to FIGS. 1, 2, 4, and 6, in general, electrons can be injected into any layer to neutralize the trapped holes there. Also, holes can be injected into a layer to neutralize trapped negative charges there using similar methods described above. To inject holes into a layer requires reversing dopant polarities and voltage polarities from embodiments to inject electrons into a layer. This would be desirable, e.g., in an insulator which traps electrons instead of holes.

While particular embodiments of the present invention have been described herein for purposes of illustration, many modifications and changes will become apparent to those skilled in the art. Accordingly, the appended claims are intended to encompass all such modifications and changes as fall within the true spirit and scope of this invention.

The invention claimed is:

1. A charge neutralizing method, comprising:
presetting a limit sufficient for a trapped charge in a charge accumulation layer to cause a semiconductor structure to malfunction if the limit is exceeded by the trapped charge, wherein the semiconductor structure comprises (a) a semiconductor layer, (b) the charge accumulation layer on top of the semiconductor layer, (c) a doped region in direct physical contact with the semiconductor layer, and (d) a device layer on top of and in direct physical contact with the charge accumulation layer, wherein the device layer comprises a plurality of device regions electrically insulated from each other, wherein the charge accumulation layer comprises trapped charges of a first sign, and wherein the doped region and the semiconductor layer form a P-N junction diode;
after said presetting the limit, generating free charges in the P-N junction diode, wherein the free charges are of a second sign opposite to the first sign;
after said generating free charges in the P-N junction diode, ascertaining that the trapped charge in the charge accumulation layer exceeds the limit that had been preset; and
responsive to said ascertaining, applying a first voltage to the doped region and applying a second voltage to the semiconductor layer and applying a third voltage to the device layer, wherein the third voltage exceeds the first voltage and the second voltage and causing acceleration of the free charges toward the device layer, resulting in some of the free charges entering the charge accumulation layer and neutralizing some of the trapped charges in the charge accumulation layer.

2. The method of claim 1, wherein said applying the first voltage, said applying the second voltage, and said applying the third voltage are performed periodically at only discrete times during a lifetime of the semiconductor structure.

3. The method of claim 1, wherein the first voltage exceeds the second voltage, wherein said generating free charges comprises reverse biasing the P-N junction diode which results in a depletion layer at a P-N junction of the P-N junction diode.

4. The method of claim 1, wherein the second voltage exceeds the first voltage by at least 1 volt, and wherein said generating the free charges comprises forward biasing the P-N junction diode.

5. The method of claim 4,
wherein the free charges are electrons,
wherein the trapped charges are trapped holes,
wherein the semiconductor layer is P-type doped, and
wherein the doped region is N-type doped.

6. The method of claim 1, wherein the charge accumulation layer comprises an oxide material.

7. The method of claim 1, wherein said applying the first voltage, said applying the second voltage, and said applying the third voltage are performed once and no more than once during a lifetime of the semiconductor structure.

8. The method of claim 3, wherein said generating free charges in the P-N junction diode comprises placing the semiconductor on a heat chuck to create electron-hole pairs in a depletion layer of the P-N junction.

* * * * *